United States Patent
Bi

(10) Patent No.: US 9,153,760 B2
(45) Date of Patent: Oct. 6, 2015

(54) METHOD OF MAKING A HEAT RADIATING STRUCTURE FOR HIGH-POWER LED

(75) Inventor: Xiaofeng Bi, Guangdong (CN)

(73) Assignee: DONGGUAN KINGSUN OPTOELECTRONIC CO., LTD, Dongguan (CN)

( * ) Notice: Subject to any disclaimer, the term of this patent is extended or adjusted under 35 U.S.C. 154(b) by 160 days.

(21) Appl. No.: 13/990,421

(22) PCT Filed: Aug. 30, 2012

(86) PCT No.: PCT/CN2012/080761
§ 371 (c)(1),
(2), (4) Date: May 29, 2013

(87) PCT Pub. No.: WO2013/067840
PCT Pub. Date: May 16, 2013

(65) Prior Publication Data
US 2013/0298396 A1    Nov. 14, 2013

(30) Foreign Application Priority Data
Nov. 9, 2011 (CN) .......................... 2011 1 0351439

(51) Int. Cl.
*H05K 3/00* (2006.01)
*H05K 7/20* (2006.01)
*H01L 33/64* (2010.01)
(Continued)

(52) U.S. Cl.
CPC .............. *H01L 33/64* (2013.01); *H05K 1/0204* (2013.01); *H01L 21/4878* (2013.01); *H01L 23/3677* (2013.01); *H01L 2924/0002* (2013.01); *H05K 3/0061* (2013.01); *H05K 2201/09054* (2013.01);
(Continued)

(58) Field of Classification Search
CPC .............. H01L 2924/01079; H01L 23/49816; H01L 23/4006; H01L 2023/405; H01L 2924/01014; H05K 13/0486
USPC ............................ 29/829; 361/717; 174/250
See application file for complete search history.

(56) References Cited

U.S. PATENT DOCUMENTS 5,012,386 A * 4/1991 McShane et al. ............. 361/715
5,172,301 A * 12/1992 Schneider ..................... 361/717
(Continued)

FOREIGN PATENT DOCUMENTS

| CN | 201576701 U | 9/2010 |
| CN | 201623176 U | 11/2010 |
| WO | 2006102875 A2 | 10/2006 |

OTHER PUBLICATIONS

International Search Report issued by the International Search Authority for the PCT patent application No. PCT/CN2012/080761.

*Primary Examiner* — David Angwin

(57) ABSTRACT

A method of making a heat radiating structure for high-power LED comprises: (1) preparing a PCB board, a heat conducting plate having a heat conducting column at one side thereof and a heat radiating plate; (2) providing a locating hole penetrating both sides of the PCB board, and welding a copper plate to one side of the PCB board, while soldering an electrode welding leg to the other side of the PCB board; (3) putting the heat conducting column into the locating hole, and soldering the copper plate and the heat conducting plate together; (4) placing the one-piece of the heat conducting plate and the PCB board produced by the step (3) on a pressing equipment to adjust the height of the conducting column; (5) pasting the inner side of the heat radiating plate on the other side of the heat conducting plate fixedly.

8 Claims, 1 Drawing Sheet

(51) Int. Cl.
  *H05K 1/02*   (2006.01)
  *H01L 23/367*   (2006.01)
  *H01L 21/48*    (2006.01)

(52) U.S. Cl.
  CPC .............. *H05K 2201/10106* (2013.01); *H05K 2203/0323* (2013.01); *Y10T 29/49124* (2015.01)

(56) References Cited

U.S. PATENT DOCUMENTS

| | | | | |
|---|---|---|---|---|
| 5,991,156 A * | 11/1999 | Bond et al. | ................. | 361/707 |
| 6,376,908 B1 * | 4/2002 | Gaku et al. | ................. | 257/707 |
| 6,507,049 B1 * | 1/2003 | Yeager et al. | ................. | 257/100 |
| 6,874,910 B2 * | 4/2005 | Sugimoto et al. | ................. | 362/294 |
| 7,482,633 B2 * | 1/2009 | Chiaretti | ................. | 257/89 |
| 7,495,322 B2 * | 2/2009 | Hashimoto et al. | ................. | 257/676 |
| 7,566,154 B2 * | 7/2009 | Gloisten et al. | ................. | 362/545 |
| 7,572,037 B2 * | 8/2009 | Fukuda et al. | ................. | 362/347 |
| 7,633,093 B2 * | 12/2009 | Blonder et al. | ................. | 257/81 |
| 7,651,254 B2 * | 1/2010 | Yeh et al. | ................. | 362/555 |
| 7,671,373 B2 * | 3/2010 | Wang et al. | ................. | 257/81 |
| 7,683,394 B2 * | 3/2010 | Tomioka | ................. | 257/98 |
| 7,717,589 B2 * | 5/2010 | Nishioka et al. | ................. | 362/293 |
| 7,746,644 B2 * | 6/2010 | Tuan | ................. | 361/704 |
| 7,777,235 B2 * | 8/2010 | Mazzochette et al. | ................. | 257/81 |
| 7,891,836 B2 * | 2/2011 | Dekker et al. | ................. | 362/249.02 |
| 8,044,412 B2 * | 10/2011 | Murphy et al. | ................. | 257/81 |
| 8,373,189 B2 * | 2/2013 | Lin et al. | ................. | 257/98 |
| 8,384,117 B2 * | 2/2013 | Song et al. | ................. | 257/99 |
| 8,476,089 B2 * | 7/2013 | Chen | ................. | 438/27 |
| 8,598,606 B2 * | 12/2013 | Negley | ................. | 257/98 |
| 8,727,585 B2 * | 5/2014 | Nakayama | ................. | 362/382 |
| 8,735,935 B2 * | 5/2014 | Inoue et al. | ................. | 257/100 |
| 2003/0076034 A1 * | 4/2003 | Marshall et al. | ................. | 313/512 |
| 2003/0168720 A1 * | 9/2003 | Kamada | ................. | 257/666 |
| 2003/0230977 A1 * | 12/2003 | Epstein | ................. | 313/512 |
| 2004/0264195 A1 * | 12/2004 | Chang et al. | ................. | 362/294 |
| 2008/0019133 A1 * | 1/2008 | Kim et al. | ................. | 362/294 |
| 2008/0278917 A1 * | 11/2008 | Lin et al. | ................. | 361/715 |

* cited by examiner

METHOD OF MAKING A HEAT RADIATING STRUCTURE FOR HIGH-POWER LED

FIELD OF THE INVENTION

The present invention relates to a technology of making a heat radiating device, more particularly, to a method of making a heat radiating structure for high-power LED.

BACKGROUND OF THE INVENTION

LED has been widely used in many applications such as indicative marks application and indoor/outdoor lighting application, due to its long theoretical lifetime, low energy consumption, eco-friendly characteristic and the like. As we all know, the most crucial factor affecting the lifetime of LED is LED's heat radiation, and this is especially true for high-power LED. Existing method of making a heat radiating structure for high-power LED mainly includes successively connecting a heat sink, an aluminum substrate, a heat conductive silicone grease, a heat radiating plate and other parts together, the LED thus connects with the aluminum substrate through the heat sink, this is a simple method, however, the resulting heat radiating structure has poor performance in thermal conduction and radiation, which is largely ascribed to the structural setting of the aluminum substrate, this poor performance hence greatly affects the application field as well as the application range of the LED. The aluminum substrate is usually formed by successively superposing a protective oil layer, a copper foil layer, an insulating layer and an aluminum plate layer, whilst the insulating layer plays a positive role in electric insulation, it plays a role in thermal insulation which is not expected, hence heat produced by the LED cannot be removed timely, which finally largely affects the lifetime of the LED. Consequently, technological innovations should be made in the field of making heat radiating structures for LED to realize differentiated heat radiating structures and to solve the problem of heat radiation of the LED.

SUMMARY OF THE INVENTION

The object of the present invention is to provided a method of making a heat radiating structure for high-power LED with simple process and high production efficiency so as to overcome the above shortcomings in the prior arts, and the resulting heat radiating structure made by this method has a compact structure and is efficient in conducting and radiating heat.

In order to achieve the above object, the present invention provides the following technical solutions.

The method of making a heat radiating structure for high-power LED comprises:

(1) providing a PCB board, a heat conducting plate having a heat conducting column arranged at one side thereof and a heat radiating plate;

(2) providing a locating hole penetrating both sides of the PCB board, and welding a copper plate to one side of the PCB board, while soldering an electrode welding leg to the other side of the PCB board, then coating the surface of the copper plate with a solder paste;

(3) putting the heat conducting column from a side of the PCB board into the locating hole which side is arranged with the copper plate, and soldering the copper plate and the heat conducting plate together through reflow soldering, the heat conducting plate and the PCB board then being fixedly connected together as a one-piece; wherein the height of the heat conducting column is greater than the total thickness of the copper plate, the PCB board and the electrode welding leg;

(4) placing the one-piece of the heat conducting plate and the PCB board produced by the step (3) on a pressing equipment, and utilizing the pressing equipment to press the upper-end surface of the heat conducting column so as to adjust the height of the heat conducting column, and to make the upper-end surface of the heat conducting column and the upper surface of the electrode welding leg be on the same plane;

(5) pasting the inner side of the heat radiating plate on the other side of the heat conducting plate fixedly.

Wherein in the step (5), the outer side of the heat radiating plate is provided with a plurality of heat radiating fins.

Wherein in the step (1), the heat conducting column is formed in one piece with the heat conducting plate. Obviously, the heat conducting column could also be in the form of an attachment piece which is fixedly welded to the heat conducting plate.

Wherein in the step (1), the heat conducting column is threadedly connected with the locating hole.

Wherein in the step (1), the heat conducting plate is made from red copper based material.

Wherein in the step (1), the heat radiating plate is made from aluminum based material or copper based material.

Wherein in the step (1), the heat conducting column is made from red copper based material.

By using the above method, the advantages of the present invention are as follows: because the upper-end surface of the conducting column and the upper surface of the electrode welding leg are adjusted to be on the same plane, when the bottom of the base of LED is engaged with both of the electrode welding leg and the heat conducting column, the bottom of the base of LED could be fully contacted with the upper-end surface of the heat conducting column and a welded connection could be formed between them, without influencing the electric connection between the bottom of the base of LED and the electrode welding leg, hence the contact area between a heat conduction portion at the bottom of the base of LED and the upper-end surface of the heat conducting column is increased, in this way, the heat radiating structure made by the method of the preset invention could quickly remove out the heat produced by the LED through the heat conducting column and the heat conducting plate, consequently, its function of thermal conduction and radiation is greatly enhanced.

APPENDED DRAWING REFERENCE SIGNS

1 LED;
2 base;
3 electrode welding leg;

4 PCB board;
5 copper plate;
6 heat conducting plate;
7 locating hole;
8 heat conducting column;
9 heat radiating plate;
10 heat radiating fin.

DETAILED DESCRIPTION OF THE PREFERRED
EMBODIMENTS OF THE INVENTION

Figure 1:
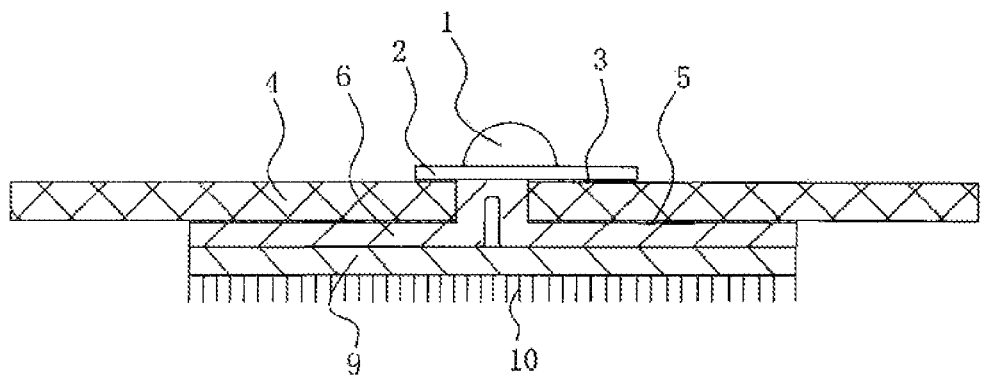
FIG. 1 is a sectional view of the heat radiating structure made by the method of the present invention.
Figure 2:
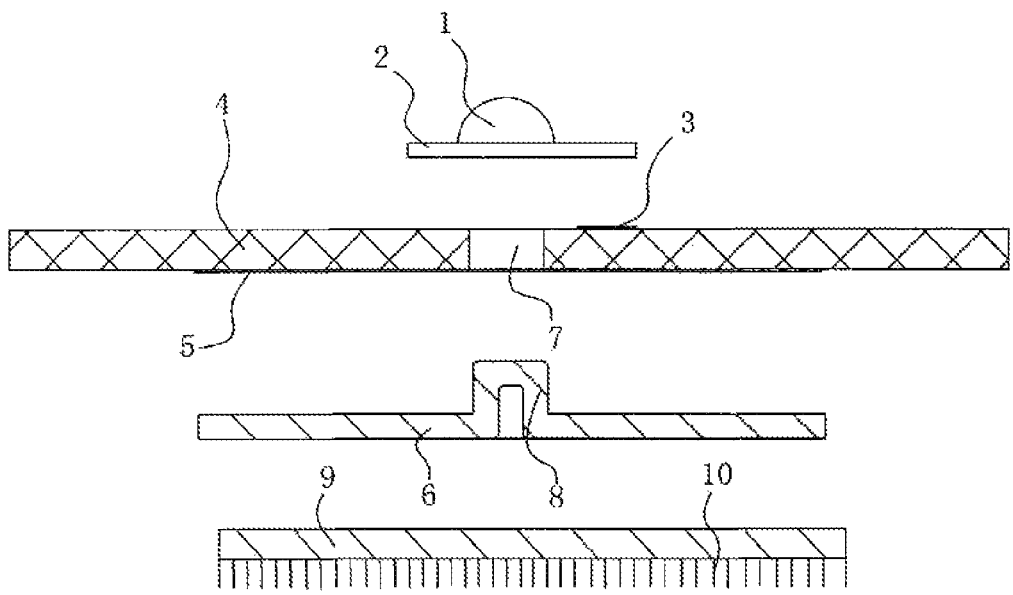
FIG. 2 is an explosive view of the heat radiating structure made by the method of the present invention.

Steps of the method of the present invention will be more fully understood and appreciated from the following detailed description, taken in conjunction with the drawings, in which FIG. 1 and FIG. 2 are integral view and explosive view of the heat radiating structure made by the method of the present invention respectively.

The method of making a heat radiating structure for high-power LED in the present invention comprises the following steps.

(1) Provide a PCB board (printed circuit board) 4, a heat conducting plate 6 having a heat conducting column 8 arranged at one side thereof, a heat radiating plate 9, and other components or materials; wherein the heat conducting plate 6 is made from red copper based material, aluminum based material and the like, the heat conducting column 8 is made from red copper based material and the heat radiating plate 9 is made from aluminum based material or copper based material. Both aluminum based material and copper based material function well in thermal conduction and radiation, the heat conducting plate 6 and the heat radiating plate 9 in the present invention are made from aluminum based material and the copper based material, which helps to achieve the objective of the present invention. Obviously, main bodies of the above-described structures could be made from other metal materials having good performance in thermal conduction and radiation. The heat conducting column 8 could be formed in one piece with the heat conducting plate 6, alternatively, the heat conducting column 8 could be in the form of an attachment piece which is fixedly welded to the heat conducting plate 6.

(2) Provide a locating hole 7 penetrating both sides of the PCB board 4, and weld a copper plate 5 to one side of the PCB board 4, then coat the surface of the copper plate 5 with a solder paste for fixedly welding the heat conducting plate 6; solder an electrode welding leg 3 to the other side of the PCB board 4 for connecting with an electrode portion at the bottom of base 2 of the LED 1.

(3) Put the heat conducting column 8 from a side of the PCB board 4 into the locating hole 7 which side is arranged with the copper plate 5, and solder the copper plate 5 and the heat conducting plate 6 together through reflow soldering so as to fixedly connect the heat conducting plate 6 and the PCB board 4 together as a one-piece. Both shape and size of the heat conducting column 8 match with that of the locating hole 7, specifically, the cross section of the heat conducting column 8 could be in the shape of round, oval, triangle or hexagon, when the cross section of the heat conducting column 8 has a round shape, the inner wall of the locating hole 7 is provide with internal screw threads, while the side wall of the heat conducting column 8 is provide with external screw threads, the heat conducting column 8 is then threadedly connected with the locating hole 7. The connection of the heat conducting column 8 and the screw threads of the locating hole 7 could improve the compactness of the heat radiating structure of the present invention, and indirectly improve the structure's function in conducting and radiating heat. In addition, the height of the heat conducting column 8 is greater than the total thickness of the copper plate 5, the PCB board 4 and the electrode welding leg 3.

(4) Place the one-piece of the heat conducting plate 6 and the PCB board 4 produced by the step (3) on a pressing equipment, and utilize the pressing equipment to press the upper-end surface of the heat conducting column 8 so as to adjust the height of the conducting column 8, and to make the upper-end surface of the conducting column 8 and the upper surface of the electrode welding leg 3 be on the same plane. This is a key step in the method of the present invention, as mentioned above, the height of the heat conducting column 8 is greater than the total thickness of the copper plate 5, the PCB board 4 and the electrode welding leg 3, and the pressing equipment is utilized to press the heat conducting column 8, hence the height and the upper-end surface of the heat conducting column 8 are pressed and adjusted until the height of the heat conducting column 8 is equal to the total thickness of the copper plate 5, the PCB board 4 and the electrode welding leg 3. After the process of pressing, the area of cross section of the heat conducting column 8 becomes larger, and an interference fit thus could be formed between the heat conducting column 8 and the locating hole 7, so that the contact area between the heat conducting column 8 and an heat conduction portion at the bottom of the base 2 becomes larger, which facilitates thermal conduction; at the same time, the upper-end surface of the heat conducting column 8 and the upper surface of the electrode welding leg 3 are on the same plane, in this way, the bottom of the base 2 could fully engage with both the upper-end surface of the heat conducting column 8 and the upper surface of the electrode welding leg 3, hence, the electrode portion at the bottom of the base 2 could be fully contacted with and welded with the electrode welding leg 3, the heat conduction portion at the bottom of the base 2 could also be fully contacted with and welded with the upper-end surface of the heat conducting column 8, the contact area between the heat conduction portion at the bottom of the base 2 and the upper-end surface of the heat conducting column 8 should be as large as possible to ensure that the heat produced from the LED 1 could be timely transferred from the conducting column 8 and the heat conducting plate 6 to the heat radiating plate 9, and finally dissipated from the heat radiating plate 9.

(5) Paste the inner side of the heat radiating plate 9 on the other side of the heat conducting plate 6 fixedly, the heat radiating plate 9 then could dissipate the heat within the heat conducting plate 6 timely. The outer side of the heat radiating plate 9 has a plurality of heat radiating fins 10 so as to provide an increased radiating area for the heat radiating plate 9, which further enhances the thermal dissipating effect of the heat radiating plate 9.

The heat radiating structure made by the method of the present invention could quickly remove the heat produced within the LED, its thermal conduction effect as well as thermal radiation effect is greatly enhanced over that of the prior art.

TABLE 1

Measured temperatures of existing heat radiating structure (old) and
the heat radiating structure made by the method of the present invention (new)

| | Input current | Environmental temperature | heat sink (old); heat conducting column (new) | aluminum substrate (old); heat conducting plate (new) | heat radiating plate |
|---|---|---|---|---|---|
| heat radiating structure (old) | 700 mA | 24.3° C. | 57.3° C. | 44.7° C. | 45.2° C. |
| heat radiating structure (new) | 700 mA | 28° C. | 48.1/51° C. | 47.3/50.3° C. | 45.6/50.3° C. |

It can be seen from the above table, high-power LEDs respectively equipped with new heat radiating structure and old heat radiating structure were used, when the same current passed through the LEDs, the temperature of the heat conducting column of new heat radiating structure was obviously lower than that of the heat sink of old heat radiating structure though the environmental temperature was higher for new heat radiating structure, however, the temperatures of the heat conducting plate and the heat radiating plate of new heat radiating structure were respectively higher than that of the aluminum substrate and the heat radiating plate of old heat radiating structure, these results fully proved that thermal radiation effect of new heat radiating structure made by the method of the present invention is better than that of old heat radiating structure.

While the preferred embodiments of the invention have been described above, it will be recognized and understood that various modifications may be made therein, and the appended claims are intended to cover all such modifications which may fall within the spirit and scope of the invention.

What is claimed is:

1. A method of making a heat radiating structure for high-power LED comprises:
    step (1): providing a printed circuit board, a heat conducting plate having a heat conducting column arranged at one side thereof, and a heat radiating plate;
    step (2): after the step (1) is complete, providing a locating hole penetrating the surface of both sides of the printed circuit board, and welding a copper plate to the surface of one side of the printed circuit board, while soldering an electrode welding leg to the surface of the other side of the printed circuit board, then coating the surface of the copper plate with a solder paste;
    step (3): after the step (2) is complete, putting the heat conducting column from the surface welded with the copper plate into the locating hole, and soldering the copper plate and the heat conducting plate together through reflow soldering, the heat conducting plate and the printed circuit board then being fixedly connected together; wherein the height of the heat conducting column is greater than the sum of the thicknesses of the copper plate, the printed circuit board and the electrode welding leg;
    step (4): after the step (3) is complete, placing the heat conducting plate and the printed circuit board that are fixedly connected together and produced by the step (3) on a pressing equipment, and utilizing the pressing equipment to press the upper-end surface of the heat conducting column so as to adjust the height of the heat conducting column, and to make the upper-end surface of the heat conducting column and the upper surface of the electrode welding leg be on the same plane; and
    step (5): after the step (4) is complete, pasting the surface of an inner side of the heat radiating plate on the surface of the other side of the heat conducting plate fixedly to form the heat radiating structure for high-power LED.

2. The method of making a heat radiating structure for high-power LED as claimed in claim 1, wherein in the step (5), the outer side of the heat radiating plate is provided with a plurality of heat radiating fins.

3. The method of making a heat radiating structure for high-power LED as claimed in claim 1, wherein in the step (1), the heat conducting column is formed in one piece with the heat conducting plate.

4. The method of making a heat radiating structure for high-power LED as claimed in claim 1, wherein in the step (1), the heat conducting column is in the form of an attachment piece which is fixedly welded to the heat conducting plate.

5. The method of making a heat radiating structure for high-power LED as claimed in claim 1, wherein in the step (1), the heat conducting column is threadedly connected with the locating hole.

6. The method of making a heat radiating structure for high-power LED as claimed in claim 1, wherein in the step (1), the heat conducting plate is made from red copper based material.

7. The method of making a heat radiating structure for high-power LED as claimed in claim 1, wherein in the step (1), the heat radiating plate is made from aluminum based material or copper based material.

8. The method of making a heat radiating structure for high-power LED as claimed in claim 1, wherein in the step (1), the heat conducting column is made from red copper based material.

* * * * *